（12） United States Patent
Tseng et al.

(10) Patent No.: US 9,653,402 B2
(45) Date of Patent: May 16, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: I-Ming Tseng, Kaohsiung (TW); Wen-An Liang, Tainan (TW); Chen-Ming Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/844,004

(22) Filed: Sep. 3, 2015

(65) Prior Publication Data

US 2017/0012000 A1 Jan. 12, 2017

(30) Foreign Application Priority Data

Jul. 6, 2015 (CN) .......................... 2015 1 0388897

(51) Int. Cl.
*H01L 29/76* (2006.01)
*H01L 29/94* (2006.01)
*H01L 23/535* (2006.01)
*H01L 29/66* (2006.01)
*H01L 29/78* (2006.01)
*H01L 29/06* (2006.01)
*H01L 29/161* (2006.01)
*H01L 29/16* (2006.01)

(52) U.S. Cl.
CPC ........ *H01L 23/535* (2013.01); *H01L 29/0653* (2013.01); *H01L 29/161* (2013.01); *H01L 29/1608* (2013.01); *H01L 29/6681* (2013.01); *H01L 29/66515* (2013.01); *H01L 29/7851* (2013.01)

(58) Field of Classification Search
CPC ............ H01L 29/7851; H01L 29/0653; H01L 29/1608; H01L 29/6681
USPC ........................................... 257/288
See application file for complete search history.

(56) References Cited

U.S. PATENT DOCUMENTS

| | | | | |
|---|---|---|---|---|
| 2005/0287731 A1* | 12/2005 | Bian | ................. | H01L 27/11517 438/201 |
| 2009/0242995 A1* | 10/2009 | Suzuki | ............. | H01L 21/82341 257/368 |
| 2012/0098070 A1* | 4/2012 | Wang | ................ | H01L 21/76834 257/368 |
| 2013/0175661 A1* | 7/2013 | Cai | .................. | H01L 21/76232 257/506 |

OTHER PUBLICATIONS

Tseng, Title of Invention: Semiconductor Device and Method for Fabricating the Same, U.S. Appl. No. 14/684,445, filed Apr. 13, 2015.

* cited by examiner

*Primary Examiner* — Theresa T Doan
(74) *Attorney, Agent, or Firm* — Winston Hsu; Scott Margo

(57) ABSTRACT

A semiconductor device and a method of fabricating the same, the semiconductor device including a fin structure, a first liner, a first insulating layer and a dummy gate structure. The fin structure is disposed on a substrate, where the fin structure has a trench. The first liner disposed in the trench. The first insulating layer disposed on the first liner. The dummy gate structure is disposed on the first insulating layer and disposed above the trench, where a bottom surface of the dummy gate and a top surface of the fin structure are on a same level.

7 Claims, 6 Drawing Sheets

SEMICONDUCTOR DEVICE AND METHOD FOR FABRICATING THE SAME

BACKGROUND OF THE INVENTION

1. Field of the Invention

The invention relates to a semiconductor device and a method of forming the same, and more particularly, to a semiconductor device having a dummy gate structure and a method of forming the same.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, integration of a metal gate and contact plugs still faces some issues in conventional FinFET fabrication. For instance, issues such as tiger tooth often arise when contact holes are formed with poor accuracy influencing the interconnection of contact plugs and overall performance of the device. Hence, how to improve the current FinFET fabrication and structure for resolving this issue has become an important task in this field.

SUMMARY OF THE INVENTION

The present invention provides a semiconductor device, comprising a fin structure disposed on a substrate, wherein the fin structure has a trench, a first liner disposed in the trench, a first insulating layer disposed on the first liner, and a dummy gate structure disposed on the first insulating layer and disposed above the trench, wherein a bottom surface of the dummy gate structure and a top surface of the fin structure are on a same level.

The present invention further provides a method for forming a semiconductor device, comprising: first, a substrate having a fin structure disposed thereon is provided, wherein the fin structure has a trench, next, a first liner in the trench is formed, a first insulating layer is formed on the first liner, and a dummy gate structure is formed on the first insulating layer and disposed above the trench, wherein a bottom surface of the dummy gate structure and a top surface of the fin structure are on a same level.

The semiconductor device and the forming method thereof in the present invention utilizes adjusting the forming time of the trench and selectively forming the spacer layer on the sidewalls of the trench to shrink the critical dimension of the trench such that one single dummy gate structure is allowed to stretch over the etched edges of two adjacent fin structures and the trench between the two adjacent fin structures, thereby dramatically increasing the integration. Through such arrangement, it is sufficient to avoid the critical dimension of the trench opening being enlarged due to overreaction with or over-consumption by oxygen provided in the forming processes of the shallow trench isolation or the dielectric layer, such as the flowable chemical vapor deposition process or the thermal oxidization process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
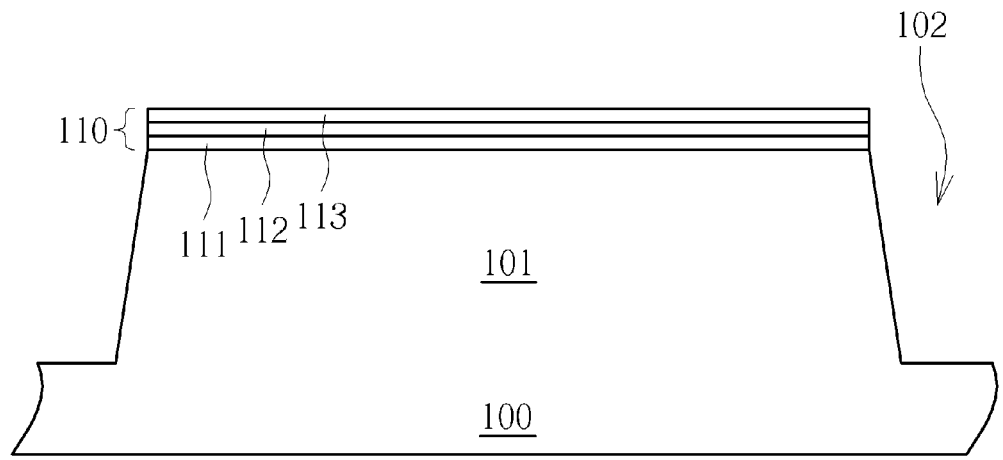
FIG. 1 to FIG. 6 are schematic diagrams illustrating a method of forming a semiconductor device according to a first embodiment of the present invention.
Figure 2:
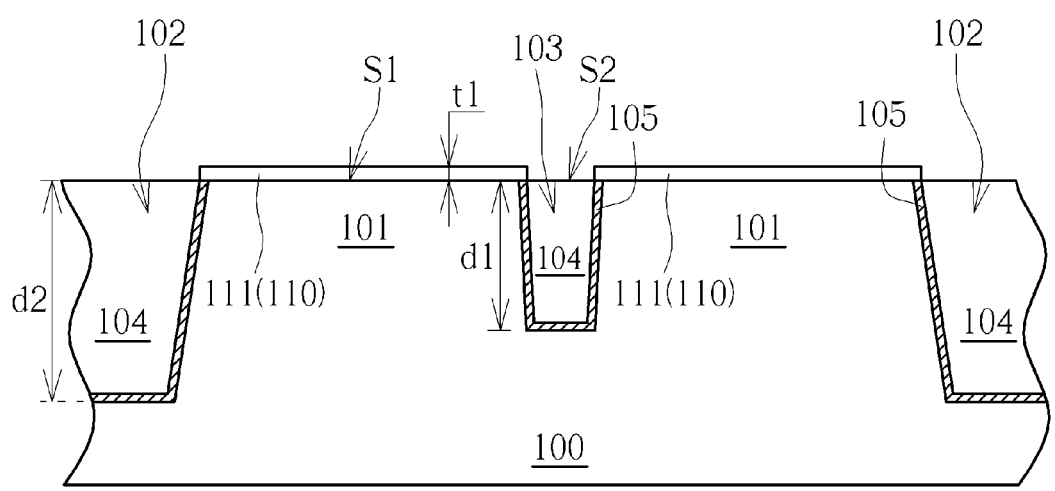
Figure 3:
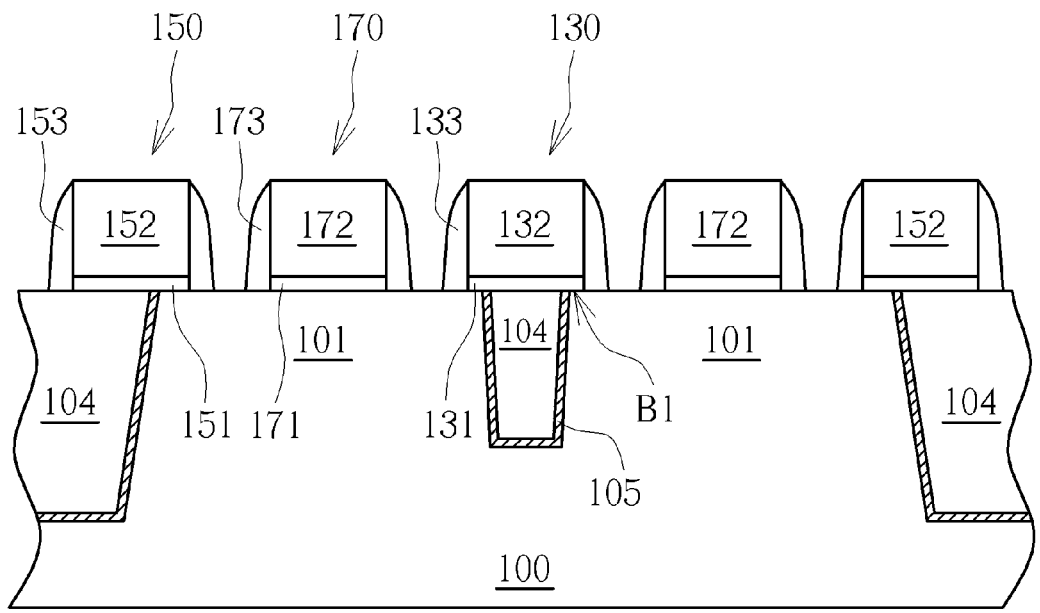
Figure 4:
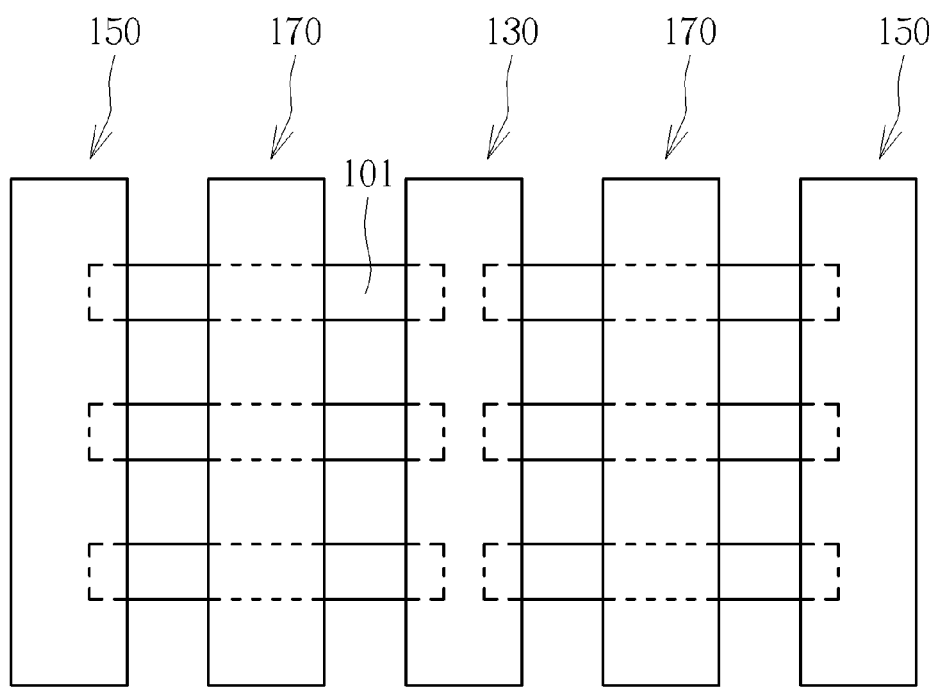

Please refer to FIG. 1 to FIG. 6, which are schematic diagrams illustrating a method of forming a semiconductor device according to the first embodiment of the present invention, wherein FIG. 4 shows a top view of the semiconductor device in forming steps. First of all, as shown in FIG. 1, a substrate 100 is provided, the substrate 100 for example includes a semiconductor substrate, such as a silicon substrate, a silicon-containing substrate or a silicon-on-insulator (SOI) substrate, and at least one fin structure 101 is formed in the substrate 100. In an example of bulk silicon, the fin structures 101 may be formed preferably through a sidewall image transfer (STI) process. The process may include forming a plurality of patterned sacrificial layers (not shown in the drawings) on the substrate 100 by using a photolithography and an etching process, performing a depositing and an etching processes sequentially to form a spacer (not shown in the drawings) at sidewalls of each of the patterned sacrificial layers, and then removing the patterned sacrificial layers and performing another etching process by using the spacer as a mask, thereby transferring the patterns of the spacer to a monolayered or a multilayered patterned mask 110, for example a composite mask structure consisting of a silicon oxide layer 111, a silicon nitride layer 112 and a silicon oxide layer 113. After that, another etching process is performed to transfer the patterns of the patterned mask 110 to the substrate 100 underneath, and to form a plurality of trenches 102 and to define each fin structure 101 simultaneously. Also, in another embodiment, a fin cut process may be further performed to form the fin structures 101 according to the practical requirement, for example, the fin structures 101 parallel to each other.

Alternatively, in another embodiment, the formation of the fin structures 101 may also be accomplished by first forming a patterned hard mask (not shown in the drawings) on the substrate 100, and then performing an epitaxial process on the exposed substrate 100 through the patterned hard mask to form a semiconductor layer (not shown in the drawings), such as silicon or silicon germanium layer. The semiconductor layer may then be used as the corresponding fin structure. Otherwise, in another embodiment, if the substrate is an SOI substrate (not shown in the drawing), the patterned mask 110 may be used to etch a semiconductor layer (not shown in the drawings) on the substrate until reaching a bottom oxide layer (not shown in the drawing) underneath to form the corresponding fin structures.

Next, as shown in FIG. 2, another fin cut process is performed through the patterned mask 110, to remove a portion of the fin structures 101 by using an etching process, and to form a trench 103 in the substrate 100. Please note that the trench 103 has a depth d1 less than that of the trench 102. For example, the depth d1 of the trench 103 may be 500 angstroms to 900 angstroms, and a depth d2 of the trench 102 may be 900 angstroms to 1200 angstroms, but not limited thereto. In other words, in one embodiment, the formation of the trench 103 may be integrated with a general fin cut process to form the desired layout or to remove unnecessary portions of the fin structures while the trench 103 is formed. Otherwise, in another embodiment, the trench 103 and the trench 102 may also be formed simultaneously through a double patterning or a multiple patterning process, by using photolithography-photolithography-etch (2P1E) steps, or photolithography-etch-photolithography-etch (2P2E) steps, but not limited thereto.

In the following, an insulating material layer (not shown in the drawings) is formed on the substrate 100, preferably through a flowable chemical vapor deposition (FCVD) process, and a chemical mechanical polishing (CMP) process and an etching back process are then performed, to form an insulating layer 104, such as silicon oxide, in the trench 102 and the trench 103. Through the aforementioned steps, a top surface S1 of the fin structures 101 and a top surface S2 the insulating layer 104 are on a same level, such that, the insulating layer 104 filling up the trench 102 may function as a shallow trench isolation (STI). It is noted that, in one embodiment, a portion of the patterned mask 110 (such as the silicon nitride layer 112 and the silicon oxide layer 113) may be removed selectively while the chemical mechanical polishing process and the etching back process are performed, due to different structural characteristics of tri-gate transistor device or dual-gate transistor device formed subsequently, as shown in FIG. 2. However, the present invention is not limited thereto, and in another embodiment, the patterned mask 110 may also be completely removed or retained selectively. Besides, a thickness t1 of the patterned mask 110 on the fin structure 101 may influence the thickness of the insulating layer 104 in the trench 102. Preferably, by adjusting the thickness t1 of the patterned mask 110, the top surface S1 of the fin structures 101 and the top surface S2 the insulating layer 104 are on a same level. Also, in another embodiment, a dielectric layer may be formed entirely before the insulating layer 104 is formed, to function as a liner 105, covering the substrate 100 and the fin structures 101. The liner 105 may include a monolayer structure or multilayer structure, and preferably includes silicon oxide or suitable high dielectric constant materials. The method of forming the liner 105 may include using an in situ steam generation (ISSG) process to uniformly form the liner 105 on exposed surfaces of the fin structures 101, the trench 102 and the trench 103, as shown in FIG. 2, but not limited thereto. In another embodiment, the liner 105 may also be formed through an atomic layer deposition (ALD) process, or include other dielectric materials.

Next, as shown in FIG. 3 and FIG. 4, the patterned mask 110 (namely, the silicon oxide layer 111) is completely removed, and at least one dummy gate structure, 130, 150 is formed, across the fin structures 101. In the present embodiment, the formation of the dummy gate structures 130, 150 may be integrated with a general gate forming process. For example, a gate forming process may be performed, which includes sequentially forming a gate dielectric material layer (not shown in the drawings), such as including an insulating material (e.g. silicon oxide), and a gate layer (not shown in the drawings) on the fin structures 101, and patterning the gate layer and the gate dielectric material layer, and then forming a plurality of gate structures 170, having a gate dielectric layer 171 and a dummy gate electrode 172, and a plurality of dummy gate structures 130, 150, having dielectric layers 131, 151 and gate electrodes 132, 152 respectively. Thus, in one embodiment, the gate electrodes 132, 152 of the dummy gate structures 130, 150 may include polysilicon, but the material thereof is not limited thereto and may be further modified according to the practical requirements. Subsequently, spacers 133, 153, 173 which surround the dummy gate structures 130, 150 and the gate structure 170 are formed, wherein the spacer 133, 153, 173 may include silicon nitride, silicon oxynitride or silicon carbonitride.

It is worth mentioning that, the dummy gate structure 130 across two adjacent fin structures 101 and the trench 103, and the dummy gate structure 150 across one single fin shape structure 101 and a portion of the shallow trench isolation (namely, the insulating layer 104 formed in the trench 102) are formed simultaneously, such that the dummy gate structures 130, 150 may have the gate electrode 132, 152 being thereof partially covering the fin structures 101, as shown in FIG. 3. Among them, a bottom surface B1 of the gate electrode 132 of the dummy gate structure 130 and the top surface of the insulating layer 104 are on a same level (also on the same level with the top surface S1 of the fin structure 101), as shown in FIG. 3. With such arrangement, it is sufficient to utilize such dummy gate structure 130 and the spacer 133 covering etched edges of the fin structure 101 to avoid the fin structure 101 being affected in the following forming process, such as source/drain epitaxial growing process, and to keep from structural deformation, current leakage or defects of entire electrical performance. Also, in another embodiment, a width of the gate electrode (not shown in the drawings) of the dummy gate structure 130 may be further controlled to make the gate electrode completely or partially overlapping with the trench 103 such that only the spacer 133 covers the etched edges of the fin structure 101.

Figure 5:
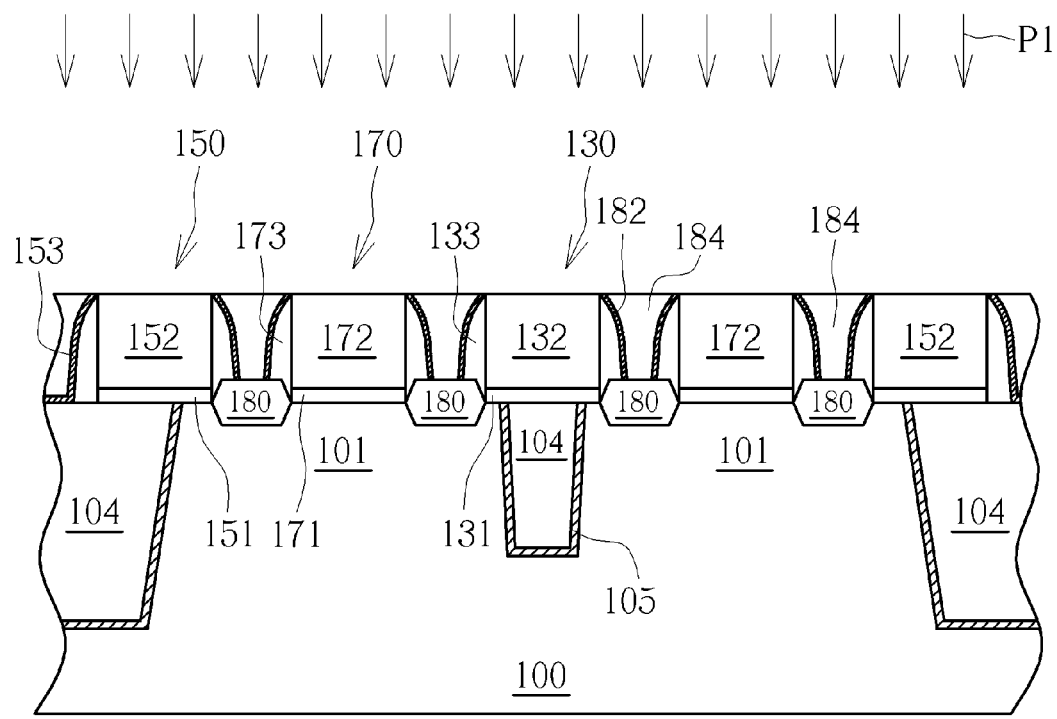
Figure 6:
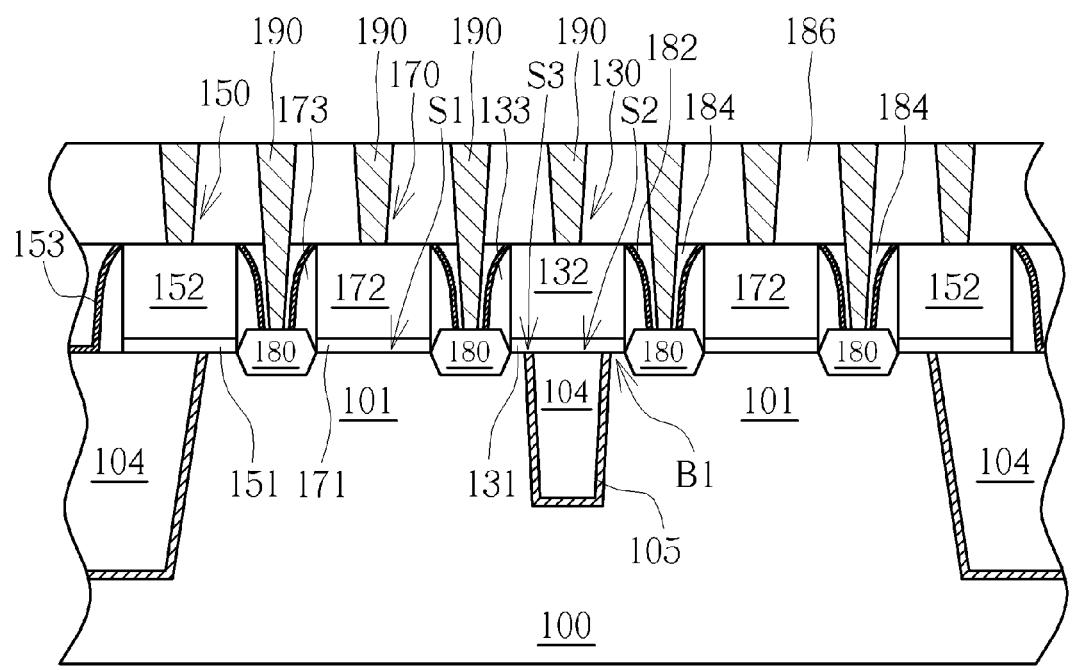

As shown in FIGS. 5-6, an epitaxial process is performed to form an epitaxial layer 180 on two sides of each gate structure 170. The epitaxial layer 180 may include a silicon-germanium epitaxial layer suited for a PMOS transistor, or a silicon-carbide epitaxial layer suited for an NMOS transistor, depending upon the electrical properties of the Multi-gate MOSFET. Thereafter, an ion implantation process may be performed to dope impurities, or impurities may be doped while performing the epitaxial process, so that the epitaxial layer 180 can be used as a source/drain region. After the epitaxial layer 180 is formed, a silicide process (or a salicide process, not shown) may be performed to form silicide in the source/drain region, wherein the silicide process may include a post clean process, a metal depositing process, an annealing process, a selective etching process, or a test process, etc. Next, a contact etching stop layer (CESL) 182 and a dielectric layer 184 are formed, entirely covering the dummy gate structure 130, 150 and the gate structure 170, and a planarization process P1 is then performed, to remove parts of the contact etching stop layer 182 and the dielectric layer 184, and at least exposing the top surface of the gate structure 170.

Next, as shown in FIG. 6, a replacement metal gate (RMG) process is then performed, to at least replace the dummy gate electrode 172 into a metal gate electrode 174. Afterwards, a dielectric layer 186 is formed to cover the dielectric layer 184, and a plurality of contact plugs 190 are formed, at least contacting the metal electrode 174 of the gate structure 170 and the source/drain region (such as the epitaxial layer 180). In addition, in the present invention, the dummy gate structures 130, 150 are usually used to protect the fin structure 101, and they may not electrically connect to other elements, or in another case, the dummy gate structures 130, 150 may be other transistors' gate. In one embodiment of the present invention, if the dummy gate structures 130 and 150 are electrically connected to the contact plugs 190 (as shown in FIG. 6), since the top surface of the insulating layer 104 in the trench 103 and the top surface of the surrounding fin structure 101 are on a same level, the dummy gate structure 130 will not "be buried" in the trench 103, thereby decreasing the leakage current.

Those processes mentioned above are similar to a conventional forming process of a transistor and will not be further detailed herein. Also, people skilled in the art shall easily realize that the semiconductor device of the present invention is not limited to being formed through the aforementioned processes, and may also be formed through other forming methods.

In the structure of the semiconductor device of the present invention, as shown in FIG. 6, including a fin structure 101 disposed on a substrate 100, wherein the fin structure has a trench 103; a liner 105 is disposed in the trench 103; a first insulating layer 104 is disposed on the liner 105; and a dummy gate structure 130 disposed on the insulating layer 104 and being across the trench 103, wherein a bottom surface B1 of the dummy gate structure 130 and a top surface S1 of the fin structure 101 are on a same level.

In one embodiment of the present invention, the structure further comprises a shallow trench isolation (the insulating layer 104 disposed in the trench 102) disposed in the substrate 100, surrounding the fin structure 101. The shallow trench isolation has a depth d2 greater than a depth d1 of the trench 103.

In one embodiment of the present invention, the dummy gate structure 130 further comprises: a dummy gate electrode 132 disposed on the trench, wherein a portion of the dummy gate electrode 132 is in the trench 103, and a spacer 133 disposed on the fin structure 101, surrounding the dummy gate electrode 132.

In one embodiment of the present invention, the structure further comprises a liner 131 disposed between the spacer 133 of the dummy gate structure 130 and the top surface of the fin structure 101.

In one embodiment of the present invention, a top surface S3 of the liner 105, a top surface S2 of the first insulating layer 104 and the top surface S1 of the fin structure 101 are on a same level.

In one embodiment of the present invention, the structure further comprises a contact etching stop layer 182 disposed on the fin structure 101 and on the dummy gate structure 130.

In one embodiment of the present invention, the structure further comprises at least one gate structure 170 disposed on the fin structure 101, and at least one contact plug 190 electrically contacted to the gate structure 170.

The following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
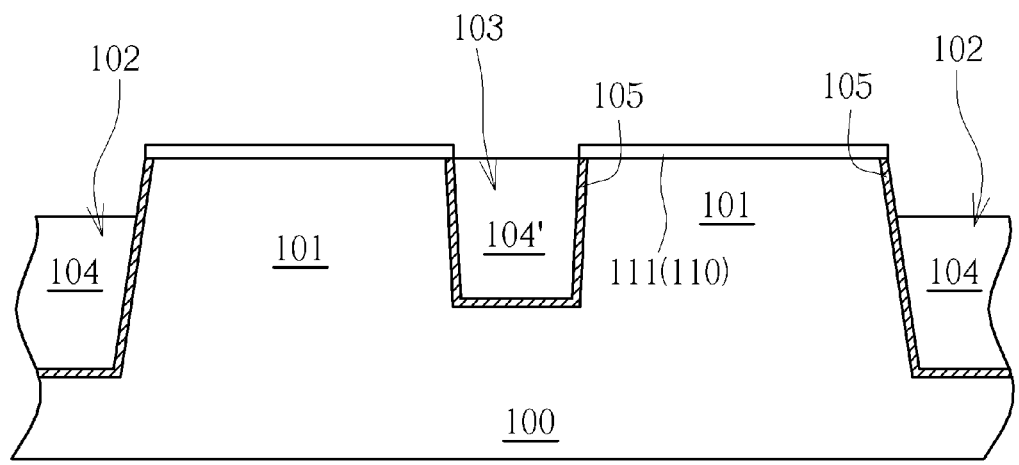
FIG. 7 to FIG. 8 are schematic diagrams illustrating a method of forming a semiconductor device according to a second embodiment of the present invention.
Figure 8:
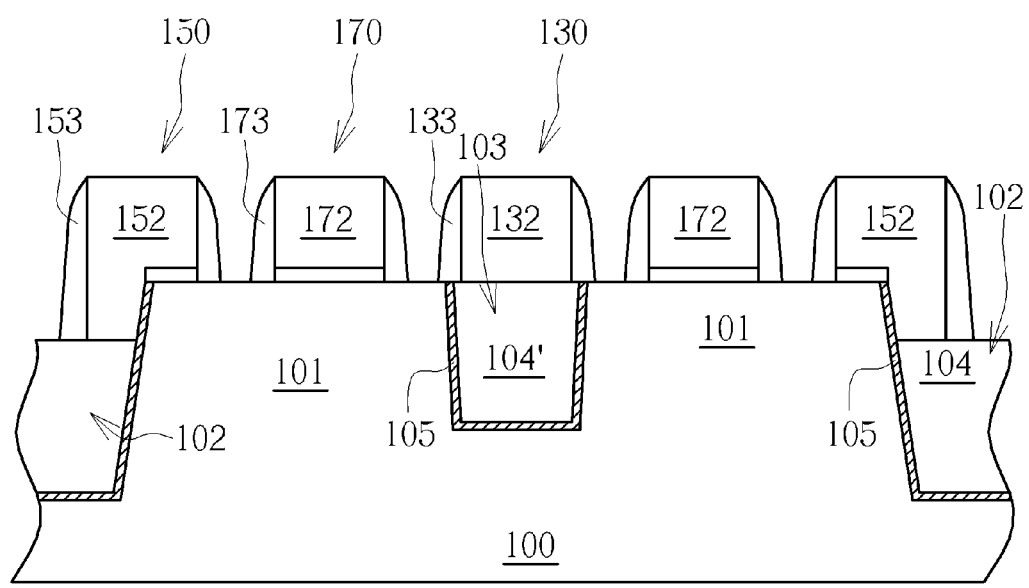

Please refer to FIG. 7 to FIG. 8, which are schematic diagrams illustrating a method of forming a semiconductor device according to the second embodiment of the present invention. The difference between this embodiment and the first preferred embodiment mentioned above is that the material of the insulating layer 104' in the trench 103 is different from that of the insulating layer 104 in the trench 102. Preferably, the insulating layer 104 can be formed of materials such as silicon oxide, and the insulating layer 104' can be formed of materials such as silicon nitride, but not limited thereto. In addition, the top surface of the insulating layer 104 (also the top surface of the STI) is lower than the top surface of the fin structure 101 or the top surface of the insulating layer 104'. Therefore, the gate structure 170 formed in the following steps can still cover on the top surface and two sidewalls of the fin structure 101, thereby increasing the channel width of the device. Other features in this embodiment are similar to that of the first preferred embodiment mentioned above, and will not be redundantly described here.

It is noteworthy that in this embodiment, the gate structure 170 and the dummy gate structures 130, 150 do not comprise the gate dielectric layer (such as the dielectric layer 131, 151, 171 shown in FIG. 6) disposed between itself and the substrate 100, in other words, the gate dielectric layer can be omitted. In this case, the silicon oxide layer on the substrate 100 can be used as the gate dielectric layer of the gate structure 170. But the present invention is not limited thereto. In another case, the gate dielectric layers can be formed under the gate structure 170 and the dummy gate structures 130, 150.

Figure 9:
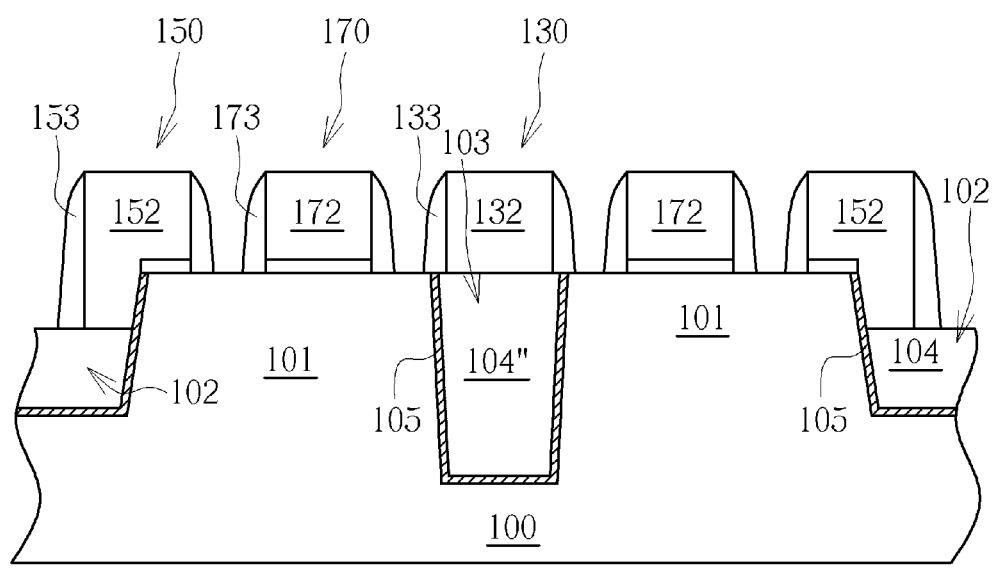
FIG. 9 is a schematic diagram illustrating a method of forming a semiconductor device according to a third embodiment of the present invention.

In addition, please refer to FIG. 9, which is schematic diagrams illustrating a method of forming a semiconductor device according to the third embodiment of the present invention. In this embodiment the depth of the insulating layer 104" is deeper than that of the trench 102. Other features in this embodiment are similar to that of the second preferred embodiment mentioned above, and will not be redundantly described here.

Figure 10:
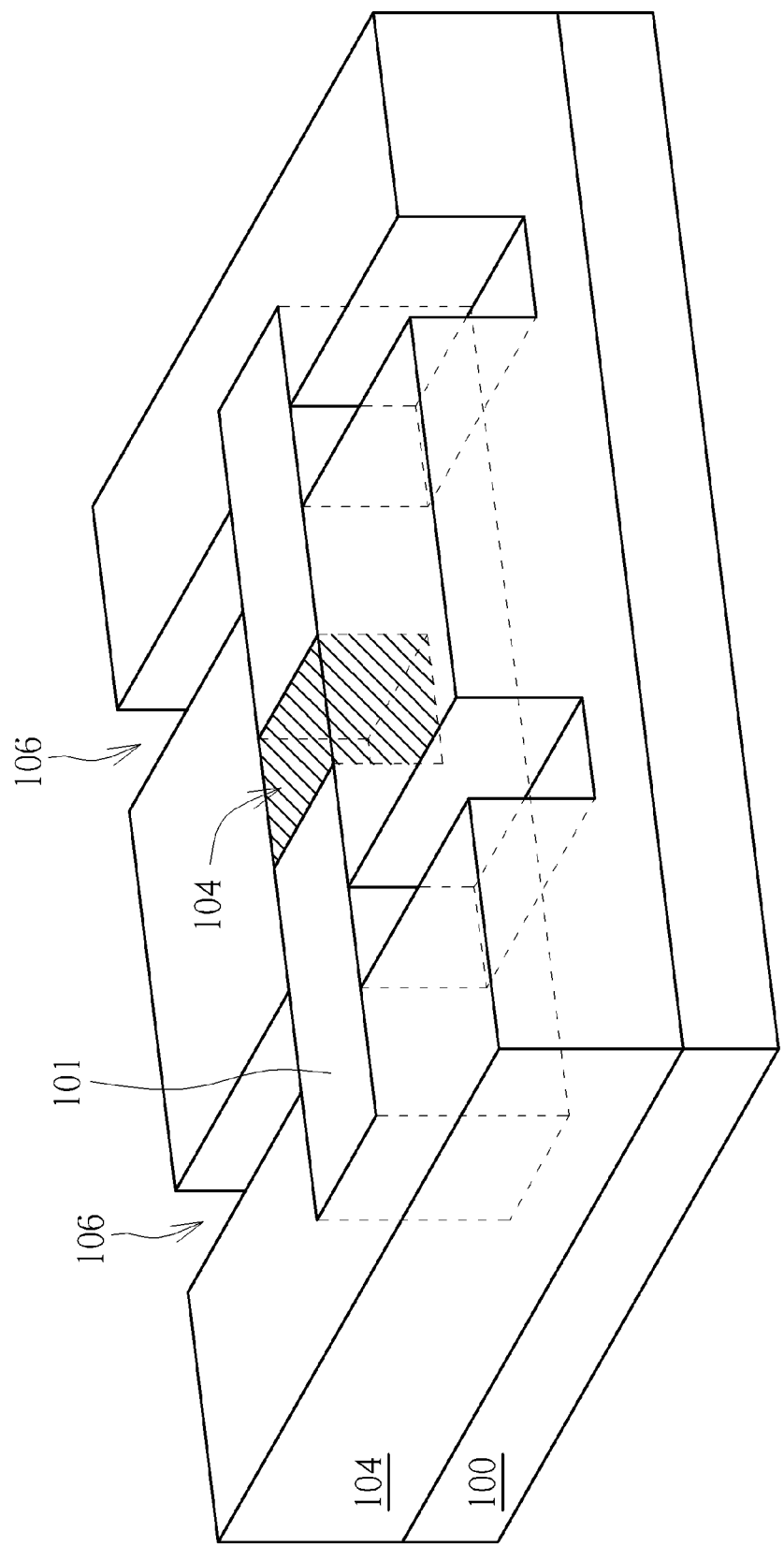
FIG. 10 is a schematic diagram illustrating a method of forming a semiconductor device according to a fourth embodiment of the present invention.

Please refer to FIG. 10, which is a schematic diagram illustrating a method of forming a semiconductor device according to the fourth embodiment of the present invention. In order to simplify the figure, partial elements such as the liner are not shown in FIG. 10. After the insulating layer 104 is filled in the trench (please also refer to FIG. 2), in this step, the top surface of insulating layer 104 and the top surface of the fin structure 101 are on a same level. In order to increase the channel width, an etching process can be performed, to form a recess 106 surrounding the fin structure 101, and the recess 106 mentioned above is used to accumulate the gate structure 170 which is formed in the following steps (please also refer to the first preferred embodiment mentioned above). Therefore, the gate structure also covers the top surface and two sidewalls of the fin structure 101, thereby increasing the channel width of the device. Other features in this embodiment are similar to that of in the first preferred embodiment mentioned above, and will not be redundantly described here.

In summary, the semiconductor device and the forming method thereof in the present invention utilizes adjusting the forming time of the trench and selectively forming the spacer layer on the sidewalls of the trench to shrink the critical dimension of the trench such that one single dummy gate structure is allowed to stretch over the etched edges of two adjacent fin structures and the trench between the two adjacent fin structures, thereby dramatically increasing the integration. Through such arrangement, it is sufficient to avoid the critical dimension of the trench opening being enlarged due to overreaction with or over-consumption by oxygen provided in the forming processes of the shallow trench isolation or the dielectric layer, such as the flowable chemical vapor deposition process or the thermal oxidization process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   two adjacent fin structures disposed on a substrate, and a trench disposed between the two adjacent fin structures;
   a first liner disposed in the trench;
   a first insulating layer disposed on the first liner;
   a shallow trench isolation disposed in the substrate and surrounding the two fin structures, wherein a bottom surface of the shallow trench isolation is higher than a bottom surface of the first insulating layer, and a top surface of the shallow trench isolation is lower than a top surface of the first insulating layer;
   a dummy gate structure disposed on the first insulating layer and disposed right above the trench, wherein a bottom surface of the dummy gate structure and a top surface of the fin structure are on a same level; and
   a first gate structure disposed on the fin structure and disposed on the shallow trench isolation simultaneously.

2. The semiconductor device according to claim 1, wherein the dummy gate structure further comprises:
   a dummy gate electrode disposed on the trench, wherein a portion of the dummy gate electrode is in the trench; and
   a spacer disposed on the fin structure, surrounding the dummy gate electrode.

3. The semiconductor device according to claim 2, further comprising:
   a second liner disposed between the spacer of the dummy gate structure and the top surface of the fin structure.

4. The semiconductor device according to claim 1, wherein a top surface of the first liner, a top surface of the first insulating layer and the top surface of the fin structure are on a same level.

5. The semiconductor device according to claim 1, further comprising a contact etching stop layer disposed on the fin structure and on the dummy gate structure.

6. The semiconductor device according to claim 1, further comprising at least one second gate structure disposed on the fin structure.

7. The semiconductor device according to claim 6, further comprising at least one contact plug electrically contacted to the second gate structure.

* * * * *